United States Patent [19]

Malocha et al.

[11] 4,369,390
[45] Jan. 18, 1983

[54] SYMMETRIC BEAM WIDTH COMPRESSION MULTISTRIP COUPLER

[75] Inventors: Donald C. Malocha, Longwood, Fla.; Robert S. Wagers, Richardson; Jeffrey H. Goll, Dallas, both of Tex.

[73] Assignee: Texas Instruments Incorporated, Dallas, Tex.

[21] Appl. No.: 229,709

[22] Filed: Jan. 30, 1981

[51] Int. Cl.³ .......................................... H01L 41/08
[52] U.S. Cl. ............................... 310/313 B; 333/195; 310/313 D
[58] Field of Search ........... 310/313 R, 313 B, 313 D; 333/150, 153, 193, 195, 196

[56] References Cited

U.S. PATENT DOCUMENTS 3,898,592  8/1975  Solie .................................... 333/195
3,947,783  3/1976  Maerfeld ....................... 310/313 D
4,079,342  3/1978  Solie .................................... 333/195

OTHER PUBLICATIONS

Broadband, Amplitude and Phase Compensating Transducers for 1980 Ultrasonics Symposium, Monolithic Convolvers, W. R. Smith, IEEE Transactions on Sonics and Ultrasonics.
Improvements in Metalized R.A.C. Design, J. T. Godfrey, et al., IEEE Transactions on Sonics Jul. 4, 1978, Ultrasonics Symposium, and Ultrasonics.
Wave Electronics, C. Maerfield, vol. 2, (1976), p. 105, Elsevier Scientific Publishing Co., Amsterdam.

Primary Examiner—Mark O. Budd
Attorney, Agent, or Firm—Robert C. Mayes; Melvin Sharp; James T. Comfort

[57] ABSTRACT

A structure for compressing an acoustic surface wave into a symmetric higher energy density output surface acoustic wave. Conductive strips are placed in parallel upon a piezoelectric surface. When a symmetric input is generated at one side of the multistrip coupler, the energy of the input wave is compressed into the center channel and is presented at the output in a single moded symmetric form.

14 Claims, 3 Drawing Figures

SYMMETRIC BEAM WIDTH COMPRESSION MULTISTRIP COUPLER

The Government has rights in this invention pursuant to Contract No. DAAB07-78-C-0172, awarded by the Department of the Army.

BACKGROUND OF THE INVENTION

Surface acoustic waves have become an important and useful technology, with applications that include spread spectrum communications. Beam compression is useful to increase the effective energy density of the beam. This has been accomplished by several methods: parabolic horn compressors, track changing multistrip couplers, and reflecting array compressors. Each of these beam compression techniques, however, has an inherent distortion in the way the signal is processed. The parabolic horn has dispersion at the reflecting surfaces, additional losses multimoding and additional length. For example, see "Broadband, Amplitude and Phase Compensating Transducers for Monolithic Convolvers", W. R. Smith, 1980 Ultrasonics Symposium, IEEE Transactions on Sonics and Ultrasonics.

Track changing multistrip couplers and reflecting array compressors both have a problem with an asymmetric side lobe which is difficult to remove. See "Improvements in Metalized R.A.C. Design", J. T. Godfrey, et al, July 4, 1978 Ultrasonics Symposium, IEEE Transactions on Sonics and Ultrasonics. See also C. Maerfeld, *Wave Electronics*, Vol. 2, (1976), p. 105, Elsevier Scientific Publishing Co., Amsterdam.

Accordingly, the objective of the present invention is to reduce distortion of the wave undergoing compression and to increase the efficiency of the compressor.

SUMMARY AND BRIEF DESCRIPTION OF THE INVENTION

This invention relates to a beam width compressor for surface acoustic waves. A series of conductive strips are placed upon the surface of a piezoelectric material and positioned parallel to each other in such a way that an imposed surface acoustic wave travels across the strips at approximate right angles to the direction of the strips. The strips are placed such that a center channel has a slightly reduced periodicity from that of the side portions. A surface acoustic wave imposed on the longer side portions is transferred to a narrowed beam in the center channel, resulting in a higher energy density than that of the input wave. This results in a beam width compressor having a symmetric output. Additionally, the compressor induces less distortion since the strip ends are a relatively large distance from the output port. The combination of the symmetric output and less induced distortion result in a single moded output wave form, thereby increasing the efficiency of the compressor.

Normal use of this invention will include an input means, such as a transducer or other surface wave generating means, and an output means. The compressed wave output can be detected by a waveguide structure, as in convolver applications, or an output transducer or other means.

Aluminum strips on a piezoelectric surface layer of lithium niobate work well, but a substrate made entirely of a piezoelectric such as lithium niobate, lithium tantalate or berlinite will also work well. A zinc oxide film on a non-piezoelectric substrate such as silicon, gallium arsenide or other dielectric can also be useful.

DETAILED DESCRIPTION OF THE DRAWINGS

Figure 1:
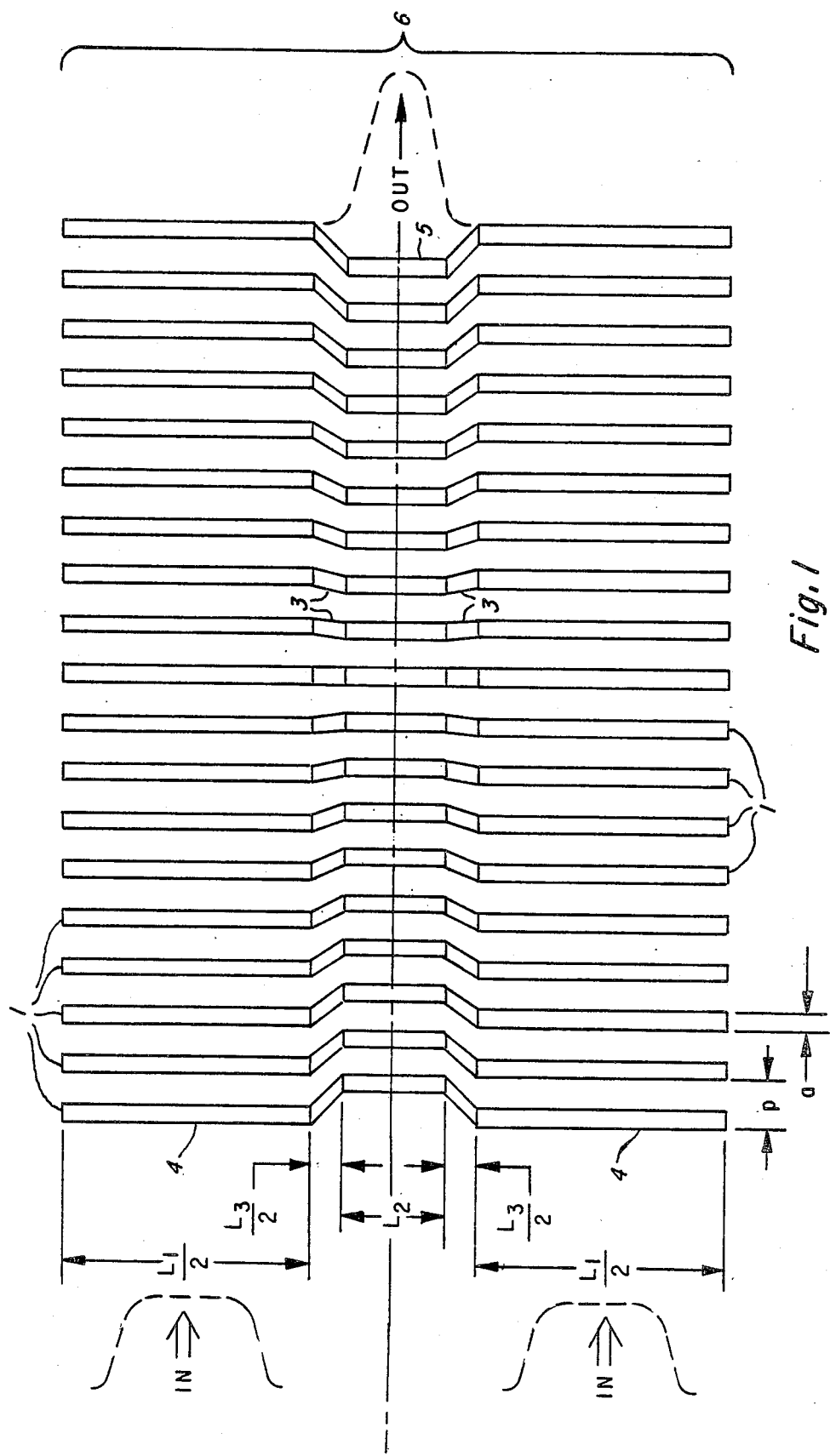
FIG. 1 is a plan view of one embodiment of a symmetric beam width compressor multistrip coupler constructed in accordance with the present invention.

Referring to FIG. 1, strips 6, of conductive material, are shown in proper relationship to each other, lying in a single plane on the surface of a suitable substrate. The long side portions 1, are electrically connected to each other by the connecting portions 3, and the center channel portions 2. Thus, the designer will plan the compressor using formulas for compression ratios, periodicity P, of the strips necessary for the frequencies desired, and the strip width a, necessary for a desired coupling constant. These design formulas are readily derived from well known formulas for asymmetric track changers as in the article by C. Maerfeld cited above, incorporated herein by reference. The input regions 4, are each one-half $L_1$. The output region 5, is $L_2$ in length and the compression ratio is given by $L_1/L_2$. The coupling strip portions 3, are electrically conductive connectors between $L_1$ and $L_2$, and the length of these connectors $L_3$, should be kept to a minimum, to avoid creating additional distortion.

The reduced periodicity of the center channel results in an energy transfer to that channel, thus if a symmetric wave is imposed on both sides at 4, a resultant compressed wave at the output 5, has a symmetric form.

Figure 2:
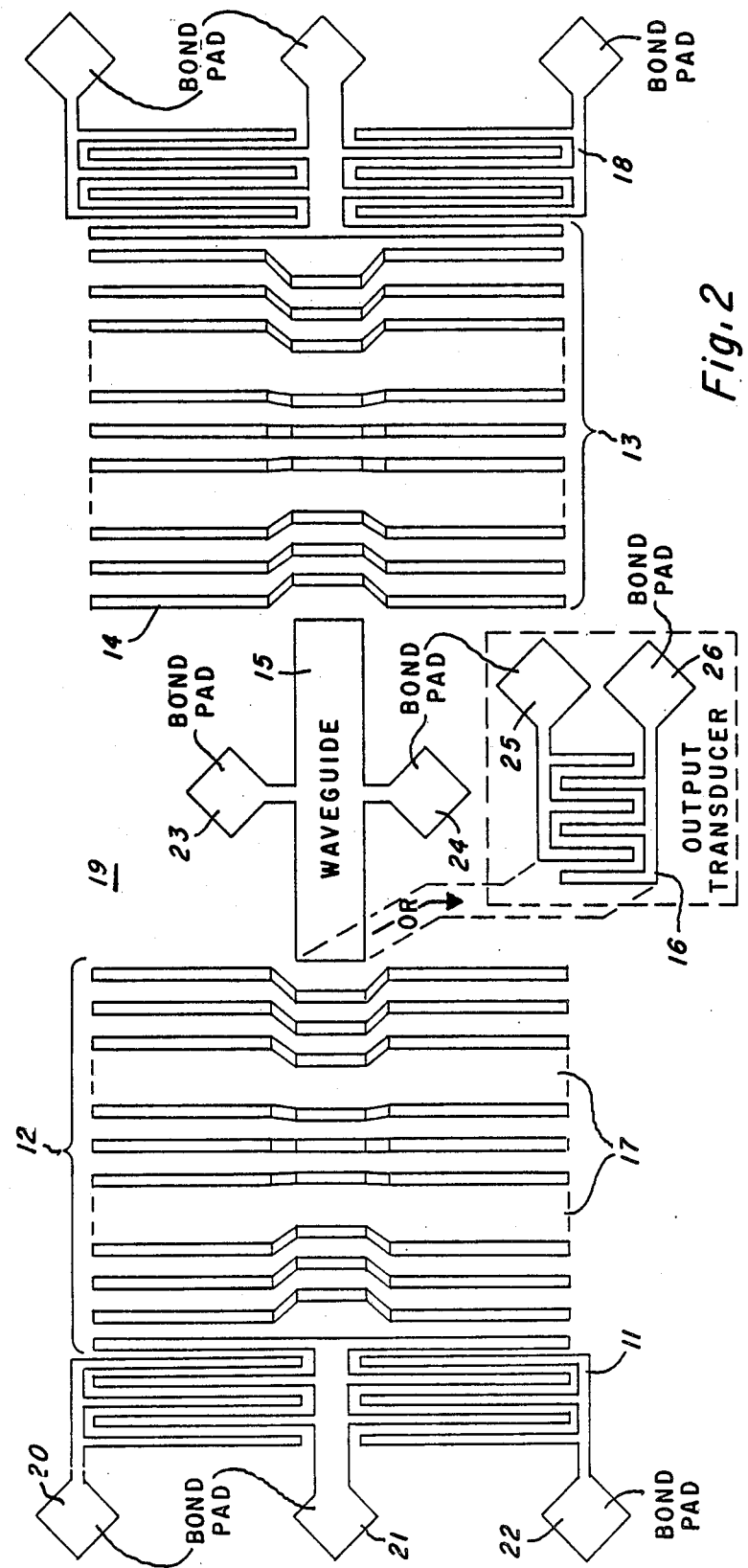
FIG. 2 is a plan view of an alternative embodiment of a symmetric beam width compressor multistrip coupler shown with an input transducer and waveguide structure displayed in a form for normal operation. Also shown in an alternative output transducer.

Referring to FIG. 2, the coupler of the present invention 12, is shown in proper relationship to additional elements necessary for preferred operation. The input transducer 11, was placed adjacent to the coupler 12, such that the surface wave generated is directed across the compressor at a 90° angle. Any significant deviation from the perpendicular will tend to degrade performance. Output is directed into a waveguide structure 15, or an alternative output such as an output transducer 16. Portions of the invention are not shown so that the relationships of input and output devices to the invention may be shown. A second compressor structure 14, similar to 12, is required for convolver applications, together with a second input transducer 18.

The substrate 19, of the invention was formed by cutting a lithium niobate crystal such that the surface acoustic waves will propagate along the Z direction of the Y-cut $LiNbO_3$. The surface was then polished in a normal manner. Using conventional photolithographic techniques, a layer of aluminum was deposited, then etched to leave the configuration of strips and connections shown in FIG. 2. The thickness of all portions of the strips is hundreds to thousands of Angstroms for good electrical conductivity, and reduction of resistivity losses.

In operation, bond pads 20 and 22 are connected to one terminal or a signal source, and bond pad 21, is connected to the other terminal. The signal thus generated across the compressor is symmetric with respect to bond pad 21, the center channel forming the axis of symmetry.

Figure 3:
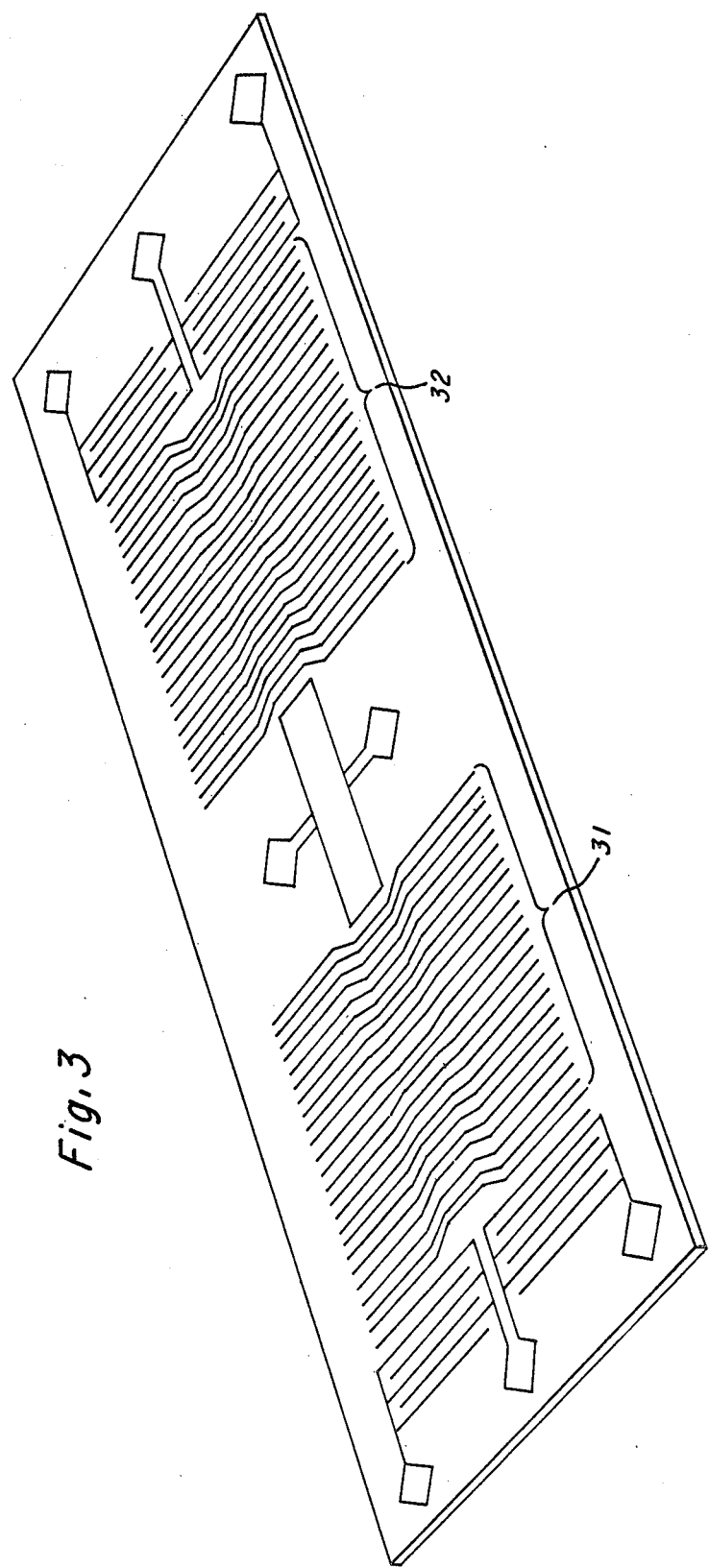
FIG. 3 is a perspective view of the surface acoustic wave convolver utilizing the present invention.

Referring to FIG. 3, the planar surface of the surface acoustic wave convolver is seen from a perspective view. This embodiment utilizes two symmetric beam compressors, one shown at 31, and the second at 32. This embodiment is essentially complete in form and requires only a signal or signals to be imposed for compressor and convolver operation.

An asymmetric track changer has the strip ends positioned in a linear relationship with the output, thus the side lobe distortion caused by the strip ends is projected into the output transducer or waveguide structure. This embodiment, however, has the strip ends positioned at a much greater distance from the output, and not in a linear relationship with the output. The strip end distortion is thus not projected directly into the output device. Additionally, the distortion of one side is reduced further by the symmetric and offsetting distortion of the opposite side.

Other uses of the present invention include light modulation systems in which a higher energy density acoustic wave is useful for modulating a reflected light beam or a light beam passing through the piezoelectric solid at approximate right angles to the direction of travel of the acoustic beam.

While particular embodiments of a symmetric beam width compressor have been disclosed and described, it will be understood that various modifications, changes, substitutions and alterations may be made without departing from the spirit and scope of the invention which is defined by the appended claims.

What is claimed is:

1. A structure for compressing a surface acoustic wave beam comprising:
   a. A substrate having a surface layer of piezoelectric material capable of propagating a surface acoustic wave: and
   b. A multistrip coupler upon the surface of said piezoelectric layer, comprised of thin conductive strips at approximate right angles to the direction of propagation of said wave and symmetrical with respect to the direction of propagation;
   c. said conductive strips having a spaced, aligned relationship with a center channel having smaller interspaced distances between strips than the distances between the side portions of the strips, said side portions additionally being longer than the center strip portions;
   d. means for generating an acoustic surface wave in such a manner that said wave propagates across said multistrip coupler and said generated wave having as input ports both of the said longer side portions of the multistrip coupler; and
   e. means for detecting the resultant compressed beam wave at the center channel output.

2. A structure as set forth in claim 1, wherein said substrate is comprised entirely of piezoelectric material.

3. A structure as set forth in claim 1, wherein said substrate is comprised of lithium niobate, lithium tantalate or berlinite.

4. A structure as set forth in claim 1, wherein said surface layer of piezoelectric material is comprised of zinc oxide.

5. A structure as set forth in claim 1, wherein said conductive strips are comprised of aluminum.

6. A structure as set forth in claim 1, wherein said means for generating acoustic surface waves is comprised of an interdigitated transducer immediately adjacent to and parallel with each of the said input ports.

7. A structure as set forth in claim 1, wherein said means for detecting the resultant compressed beam is comprised of a waveguide structure; said waveguide additionally having means to detect acoustic beams within the structure.

8. A structure as set forth in claim 1, wherein said means for detecting the resultant compressed beam is comprised of an interdigitated output transducer.

9. A structure for compressing a surface acoustic wave beam comprising:
   a. a substrate having a surface layer of piezoelectric material capable of propagating a surface acoustic wave; and
   b. a multistrip coupler upon the surface of said piezoelectric layer, comprised of thin conductive strips at approximate right angles to the direction of propagation of said wave and symmetrical with respect to the direction of propagation;
   c. said conductive strips having a spaced, aligned relationship with a center channel having smaller interspaced distances between strips than the distances between the side portions of the strips, said portions additionally being longer than the center strip portions.

10. A structure as set forth in claim 9, wherein said substrate is comprised entirely of piezoelectric material.

11. A structure as set forth in claim 9, wherein said substrate is comprised of lithium niobate, lithium tantalate or berlinite.

12. A structure as set forth in claim 9, wherein said surface layer is comprised of zinc oxide.

13. A structure as set forth in claim 9, wherein said conductive strips are comprised of aluminum.

14. A structure as set forth in claim 1, wherein said means for detecting said beam wave is comprised of an acousto-optic signal modulation apparatus.

* * * * *